(12) United States Patent
Liang et al.

(10) Patent No.: US 12,538,438 B2
(45) Date of Patent: Jan. 27, 2026

(54) ELECTRONIC DEVICE AND METHOD TO PRODUCE ELECTRONIC DEVICE

(71) Applicant: DARWIN PRECISIONS CORPORATION, Hsinchu County (TW)

(72) Inventors: Keng-Kuei Liang, Hsinchu County (TW); Chia Tsun Huang, Hsinchu County (TW); Yi Feng Chen, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 235 days.

(21) Appl. No.: 18/393,747

(22) Filed: Dec. 22, 2023

(65) Prior Publication Data

US 2024/0389244 A1 Nov. 21, 2024

(30) Foreign Application Priority Data

May 18, 2023 (TW) ................................. 112118470

(51) Int. Cl.
*H05K 1/18* (2006.01)
*H05K 3/28* (2006.01)
*H05K 5/00* (2006.01)

(52) U.S. Cl.
CPC .......... *H05K 5/0034* (2013.01); *H05K 1/189* (2013.01); *H05K 3/284* (2013.01); *H05K 2201/09063* (2013.01); *H05K 2201/10106* (2013.01); *H05K 2201/10151* (2013.01); *H05K 2201/10545* (2013.01); *H05K 2203/1322* (2013.01); *H05K 2203/1327* (2013.01)

(58) Field of Classification Search
CPC ...... H05K 5/0034; H05K 1/189; H05K 3/284; H05K 2201/09063; H05K 2201/10106
USPC .......................................................... 361/749
See application file for complete search history.

(56) References Cited

U.S. PATENT DOCUMENTS

2014/0104799 A1\* 4/2014 Chen ................. H01L 23/49811
361/767

FOREIGN PATENT DOCUMENTS

| CN | 110612781 | A | 12/2019 |
| TW | 201820943 | A | 6/2018 |
| TW | I636880 | B | 10/2018 |
| TW | 201940034 | A | 10/2019 |
| TW | 202118374 | A | 5/2021 |
| TW | M638485 | U | 3/2023 |

\* cited by examiner

*Primary Examiner* — Binh B Tran

(57) ABSTRACT

An electronic device includes a substrate and a plastic layer. The substrate has a first surface and a second surface opposite to each other; at least one of the first surface and the second surface is provided with an electronic assembly and a conducting wire; the conducting wire is electrically connected to the electronic assembly; the substrate further has a plurality of perforated holes; and the perforated holes extend to the second surface from the first surface. The plastic layer covers the first surface and the second surface, and fills in the perforated holes. Therefore, the electronic assemblies and the conducting wires can be arranged on both surfaces of the substrate, and the electronic assemblies on the first surface and the second surface both are protected by the plastic layer. In addition, also provided is a method to produce the electronic device.

13 Claims, 4 Drawing Sheets

ST5

ELECTRONIC DEVICE AND METHOD TO PRODUCE ELECTRONIC DEVICE

FIELD OF THE INVENTION

The present invention relates to an electronic device and a method to produce the electronic device, and particularly relates to an electronic device formed by combining plastic with an electronic flexible printed circuit board and a method to produce the same.

BACKGROUND OF THE INVENTION

To operate an electronic product, it is necessary to arranged buttons or related information display devices for feedback on the electronic device, for example, electronic devices such as a light-emitting diode (LED). In recent years, for the convenience in maintenance and manufacture, some manufacturers integrate a pressure touch assembly and a light emitting assembly into an integrated electronic part for easy replacement or manufacture.

In-mold electronics (In-Mold Electronics) is an electronic device which is highly reliability and light, has a three-dimensional shape and has a decorative function. By combining a substrate provided with the needed electronic assembly with a plastic shell as the three-dimensional shape, it is suitable for being applied to various operable electronic products such as automobiles, household or consumption type electronic products.

SUMMARY OF THE INVENTION

The present invention provides an electronic device. Electronic assemblies inside the electronic device are protected by plastic to have the advantages of waterproofness, dustproofness and appearance. The two opposite sides of the substrate inside the electronic device can be provided with the electronic assemblies, so that the production cost is low.

The present invention further provides a method to produce an electronic device. The produced electronic device has good precision. The electronic assemblies inside the electronic device are protected by plastic to have the advantages of waterproofness, dustproofness and appearance. The two opposite sides of the substrate inside the electronic device can be provided with the electronic assemblies, so that the production cost is low.

To achieve the above advantages, an embodiment of the present invention provides an electronic device including a substrate and a plastic layer. The substrate has a first surface and a second surface opposite to each other; at least one of the first surface and the second surface is provided with an electronic assembly and a conducting wire; the conducting wire is electrically connected to the electronic assembly; the substrate further has a plurality of perforated holes; and the perforated holes extend to the second surface from the first surface. The plastic layer covers the first surface and the second surface, and fills in the perforated holes.

In an embodiment of the present invention, the substrate is a flexible substrate.

In an embodiment of the present invention, the substrate has a body portion and a wiring portion adjacent to each other; the body portion has the first surface and the second surface; the wiring portion has at least one bus cable electrically connected to the at least one conducting wire; and the plastic layer further covers the wiring portion partially.

In an embodiment of the present invention, the plastic layer includes a first forming portion and a second forming portion; the first forming portion covers the first surface, and a part of the first forming portion passes through one of the perforated holes to cover at least a part of the second surface, so as to form a first riveting portion; and the second forming portion covers the second surface and is connected to the first riveting portion.

In an embodiment of the present invention, the perforated holes include a second perforated hole; the first forming portion has an opening in the first surface to expose the second perforated hole; and the second forming portion extends to the first surface from the second perforated hole, and forms a second riveting portion in the opening.

An embodiment of the present invention provides a method to produce an electronic device includes the following steps: providing a substrate, wherein the substrate includes a first surface and a second surface; at least one of the first surface and the second surface includes an electronic assembly and a conducting wire; the conducting wire is electrically connected to the electronic assembly; and the substrate further includes a plurality of perforated holes extending towards the second surface from the first surface; arranging the substrate in a first mold group, wherein the second surface is in contact with an inner wall surface of the first mold group, and a first gap is formed between the first surface and the inner wall surface of the first mold group; injecting plastic into the first gap to form a transition substrate; mounting the transition substrate in a second mold group, wherein the first forming portion is in contact with an inner wall surface of the second mold group, and a second gap is formed between the second surface and the inner wall surface of the second mold group; and injecting the plastic into the second gap.

In an embodiment of the present invention, the perforated holes include a first perforated hole; a recess is arranged at a position, corresponding to the first perforated hole, of the first mold group; in the step of arranging the substrate in the first mold group, a third gap is formed between the second surface and the recess, and the first gap and the third gap are communicated with each other through the first perforated hole; and in the step of injecting the plastic into the first gap, the plastic passes through the first perforated hole to form a first riveting portion in the third gap.

In an embodiment of the present invention, the perforated holes include a second perforated hole; and the step of arranging the substrate in the first mold group further includes arranging a positioning column in the second perforated hole to position the substrate and the first mold group.

In an embodiment of the present invention, the positioning column has a latching section and a supporting section; a diameter of the supporting section is greater than a diameter of the latching section, and a supporting surface is formed at a connection between the supporting section and the latching section; the latching section is adapted to be inserted into the first mold group; the supporting surface is adapted to jointly clamp the substrate with the inner wall surface of the first mold group; and the supporting section is adapted to generate an interval between the substrate and the first mold group, so as to form the first gap.

In an embodiment of the present invention, the perforated holes include a second perforated hole; the second perforated hole corresponds to the position of the positioning column; before the step of injecting the plastic into the second gap, the positioning column is removed, and an opening is formed in the first forming portion and the second through hole is exposed; in the step of injecting the plastic into the second gap, the second forming portion extends to the first surface from the second perforated hole, and forms a second riveting portion in the opening.

In an embodiment of the present invention, the substrate is a flexible substrate.

In an embodiment of the present invention, the substrate has a body portion and a wiring portion; the first surface and the second surface are arranged on the body portion; the wiring portion extends from the body portion, has at least one bus cable, and is adapted to be electrically connected with the at least one conducting wire; and the first mold group includes a first slide block, wherein the first slide block is adapted to fix the position of the wiring portion in the step of arranging the substrate in the first mold group.

In an embodiment of the present invention, the second mold group includes a second slide block, and the second slide block is adapted to fix the position of the wiring portion in the step of arranging the substrate in the second mold group.

According to the above description, the electronic device provided by the present invention can be applied on both sides as the electronic assemblies are arranged on the two opposite surfaces, so that the cost is lowered. The electronic assemblies on the substrate are wrapped by the plastic, so that it is waterproof and dustproof. When the plastic layer is made from a transmittable material, as the electronic assembles and the plastic layer can be located on the same surface of the substrate, the electronic assemblies on the substrate can be arranged as light emitting assemblies, so that the application range of the product is enlarged. According to the method to produce the electronic device, by utilizing a mold positioning structure, the substrate can be precisely placed at a fixed position, so that it has high precision. In addition, since the substrate and the plastic layer are integrally formed without an assembling step, they are not adhered with glue additionally, so the production cost is lowered.

Other objectives, features, and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF PREFERRED EMBODIMENTS

Figure 1:
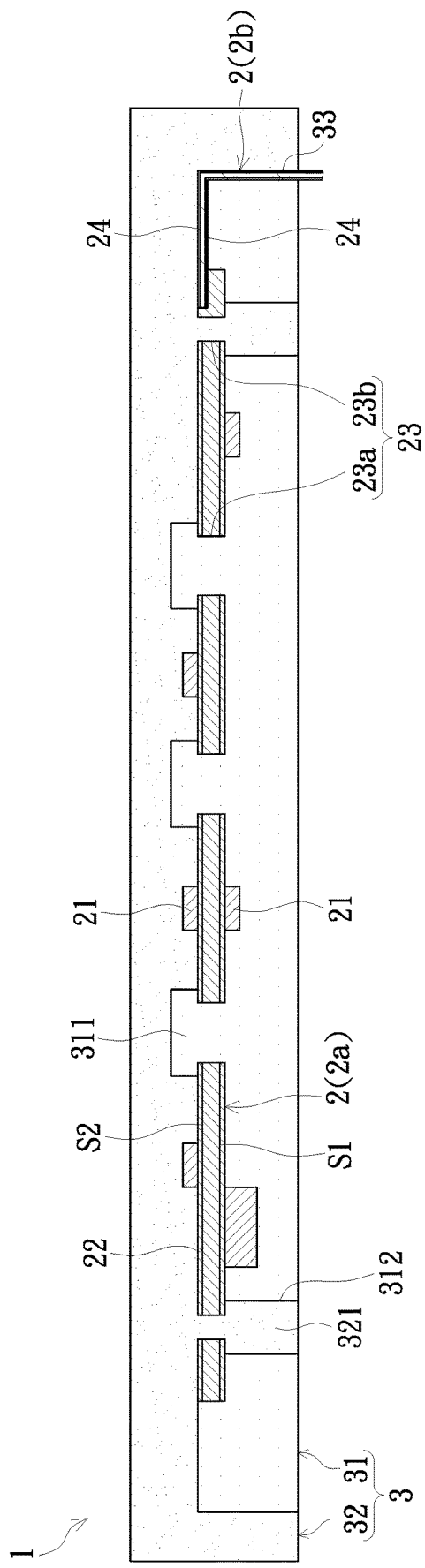
FIG. 1 is a diagrammatic cross-section of an electronic device in an embodiment of the present invention.

Terms used in the description of the embodiments of the present invention, for example, orientation or position relation such as "above" and "below" are described according to the orientation or position relation shown in the drawings. The above terms are used for facilitating the description of the present invention rather than limiting the present invention, i.e., indicating or implying that the mentioned elements have to have specific orientations and to be configured in the specific orientations. In addition, terms such as "first" and "second" involved in the description or claims are merely used for naming the elements or distinguishing different embodiments or ranges rather than limiting the upper limit or lower limit of the quantity of the elements.

FIG. 1 is a cross-sectional schematic diagram of an electronic device in an embodiment of the present invention. As shown in FIG. 1, the electronic device 1 provided by the embodiment includes a substrate 2 and a plastic layer 3. The substrate 2 has a first surface S1 and a second surface S2 opposite to each other. At least one of the first surface S1 and the second surface S2 is provided with an electronic assembly 21 and a conducting wire 22 (for convenient representation, the conducting wire is only drawn in FIG. 1). The conducting wire 22 is electrically connected to the electronic assembly 21. The substrate 2 further has a plurality of perforated holes 23. The perforated holes 23 extend to the second surface S2 from the first surface S1. The plastic layer 3 covers the first surface S1 and the second surface S2 and fills in the perforated holes 23.

As shown in FIG. 1, in the embodiment, the substrate 2 is, for example, a flexible substrate such as a flexible printed circuit (FPC) board/flexible bus cable (FFC) board, which is adapted to change its shape by way of its flexibility to meet the requirement on the shape of the electronic device 1. The electronic assembly 21 can be, for example, a light-emitting diode (LED) or a chip. In an embodiment where the plastic layer 3 is elastic or the thickness thereof will not affect the electronic device 1 enough, the electronic assembly 21 can also be a pressure sensing assembly. In other words, the electronic assembly 21 can be selected as needed. In the embodiment, the electronic assembly 21 and the conducting wire 22, for example, are arranged on both the first surface S and the second surface S2 of the substrate 2, which is not limited herein.

In the embodiment, the substrate 2 has, for example, a body portion 2a and a wiring portion 2b adjacent to each other. The body portion 2a has the first surface S1 and the second surface S2. The wiring portion 2b has a bus cable 24 (for convenient representation, the bus cable is only drawn in FIG. 1). The bus cable 24 is electrically connected to the conducting wire 22. In other words, the body portion 2a and the wiring portion 2b can be integrally formed during production. In addition, in the embodiment, the wiring portion 2b is partially wrapped by the plastic layer 3.

In the embodiment, the plastic layer 3 includes, for example, a first forming portion 31 and a second forming portion 32, which is not limited herein. The first forming portion 31 and the second forming portion 32 are divided primarily based on the sequence during production, and thus they are not limited in size and shape. As shown in FIG. 1, it can be seen that the second forming portion 32 extends from the side surface of the substrate 2 towards the first surface S1 to encircle the first forming portion 31.

In different embodiments, the first forming portion 31 and the second forming portion 32 can be either plastic of the same type, color, and transmission of light or plastic of different types, colors, and transmission of light. The thickness of the first forming portion 31 and the second forming portion 32, for example, is between 0.8 mm and 1.2 mm, which is not limited herein and can be changed as needed. In addition, the wiring portion 2b in the embodiment is, for example, a connecting surface 33 between the first forming portion 31 and the second forming portion 32, which is not limited herein.

In the embodiment, the perforated holes 23 include a first perforated hole 23a and a second perforated hole 23b. The first perforated hole 23a and the second perforated hole 23b are described thereafter and are not described herein. The first forming portion 31 covers the first surface S1, and a part of the first forming portion 31 passes through the first perforated hole 23a and covers a part of the second surface S2 to form a first riveting portion 311. The second forming portion 32 covers the second surface S2 and is connected to the first riveting portion 311. Therefore, even if the electronic device 1 is subjected to an impact, the first forming portion 31 can also be connected to the substrate 2 through the first riveting portion 311 without being separated from the substrate 2. In the embodiment, the first riveting portion 311 is, for example, further covered and protected by the second forming portion 32, which is not limited herein.

In the embodiment, the first forming portion 31 has an opening 312 in the first surface S1 and the second perforated hole 23b is exposed. The second forming portion 32 extends to the first surface S1 from the second perforated hole 23b and a second riveting portion 231 is formed in the opening 312. Therefore, even if the electronic device 1 is subjected to an impact, the second forming portion 32 can also be connected to the substrate 2 through the second riveting portion 231 without being separated from the substrate 2.

Viewed from an article of the electronic device 1, it can be known from the above that the difference between the first perforated hole 23a and the second perforated hole 23b lies in that the perforated hole 23 designed for forming the first riveting portion 311 is the first perforated hole 23a, and the perforated hole 23 designed for forming the second riveting portion 231 is the second perforated hole 23b.

In addition, there are no particular limitations to the sizes, shapes, and arrangement positions of the first riveting portion 311 and the second riveting portion 231; therefore, in some embodiments, the first riveting portion 311 can, for example, form a device pattern or frame (when the first perforated hole 23a is distributed at the edge of the substrate 2, not shown in the figure) on the second surface S2, and the second forming portion 32 can be formed next to a decorative pattern or a region encircled by the frame when the second forming portion 32 covers the second surface S2, which is not limited herein. Similarly, the second riveting portion 231 can, for example, form a device pattern or frame (not shown in the figure) on the first surface S1, and when the first forming portion 31 is formed next to the decorated pattern or a region encircled by the frame.

FIG. 2A to FIG. 2G are flowcharts of a method to produce an electronic device in an embodiment. As shown in FIG. 2A to FIG. 2G, a method to produce an electronic device (for example, the abovementioned electronic device 1) in an embodiment of the present invention includes the following steps: providing a substrate 2, wherein the substrate 2 includes a first surface S1 and a second surface S2, at least one of the first surface S1 and the second surface S2 includes an electronic assembly 21 and a conducting wire 22, the conducting wire 22 is electrically connected to the electronic assembly 21, and the substrate 2 further includes a plurality of perforated holes 23 extending towards the second surface S2 from the first surface S1 (see FIG. 2A, step ST1); arranging the substrate 2 in a first mold group 4, wherein the second surface S2 is in contact with an inner wall surface of the first mold group 4, and a first gap G1 is formed between the first surface S1 and the inner wall surface of the first mold group 4 (see FIG. 2B, step ST2); injecting plastic into the first gap G1 to form a transition substrate 11 (see FIG. 2C, step ST3); mounting the transition substrate 11 in a second mold group 5, wherein the first forming portion 31 is in contact with an inner wall surface of the second mold group 5, and a second gap G2 is formed between the second surface S2 and the inner wall surface of the second mold group 5 (see FIG. 2E, step ST4); and injecting the plastic into the second gap G2 (see FIG. 2G, step ST5).

In the embodiment, detailed structures of the substrate 2 and the perforated holes 23 can refer to the description of the abovementioned paragraphs. The first mold group 4 includes a male mold 4A and a female mold 4B, wherein the male and female molds are merely used for distinguishing different molds of the first mold group 4. A recess 41 is, for example, arranged at a position, corresponding to the perforated hole 23a, of the female mold 4B of the first mold group 4. In the step ST2 of arranging the substrate 2 in the first mold group 4, a third gap G3 is formed between the second surface S2 and the bottom surface of the recess 41, and the first gap G1 and the third gap G3 are communicated with each other through the first perforated hole 23a. In the step ST3 of injecting the plastic into the first gap G1, the plastic passes through the first perforated hole 23a to form a first riveting portion 311 in the third gap G3. In other words, the shape and depth of the recess 41 decide the shape and height (thickness) of the first riveting portion 311.

Figure 2A:
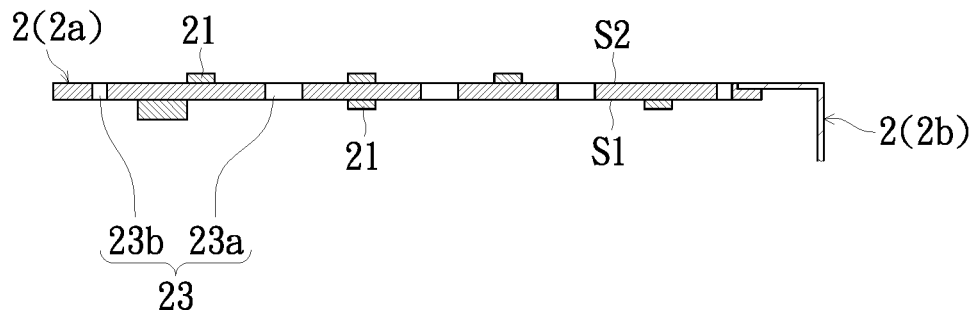
FIG. 2A to FIG. 2G are flowcharts of a method to produce an electronic device in an embodiment.
Figure 2B:
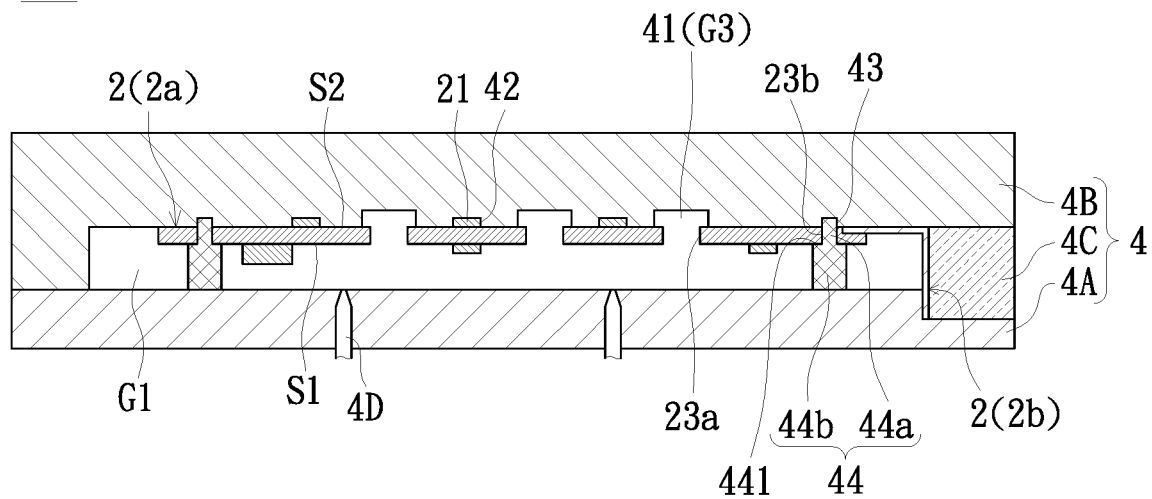

As shown in FIG. 2B, in the embodiment, the second surface S2 of the substrate 2 is attached to the inner wall surface (the surface of the female mold 4B) of the female mold 4B. Because the substrate 2 is provided with the electronic assembly 21 and to prevent the plastic from being injected into the gap generated by pushing the electronic assembly 21 against the female mold 4B during injection, the first mold group 4 (e.g., the female mold 4B in surface contact with the substrate 2) is provided with a blind hole 42 corresponding to the thickness of the electronic assembly 21, which is not limited herein. When the step ST3 is performed, because the blind hole 42 is covered with the substrate 2 around the electronic assembly 21, the plastic will not enter the blind hole 42.

As shown in FIG. 2B, in the step ST2 of arranging the substrate 2 in the first mold group 4, the way to maintain the substrate 2 in the female mold 4B of the first mold group 4 is not limited. For example, in the embodiment, the perforated holes 23 include a second perforated hole 23b, and the female mold 4B of the first mold group 4 has, for example, a positioning hole 43 corresponding to the position of the second perforated hole 23b. The step ST2 of arranging the substrate 2 in the first mold group 4 further includes arranging a positioning column 44 in the second perforated hole 23b and locking it in a positioning hole 43 to position the substrate 2 and the female mold 4B of the first mold group 4, which is not limited herein.

As shown in FIG. 2B, in the embodiment, the positioning column 44 has a latching section 44a and a supporting section 44b, which is not limited herein. The diameter of the supporting section 44b is greater than the diameter of the latching section 44a. The supporting section 44b is adapted to be in contact with the surface of the male mold 4A when the male mold 4A and the female mold 4B are combined, and a supporting surface 441 is formed at a connection between the supporting section 44b and the latching section 44a. The latching section 44a is adapted to be inserted into the positioning hole 43 of the first mold group 4 (the female mold 4B). The supporting surface 441 is adapted to jointly clamp the substrate 2 with the inner wall surface of the first mold group 4. The supporting section 44b is adapted to generate an interval between the substrate 2 and the first mold group 4, so as to form the first gap G1. In other words, in the embodiment, the substrate 2 is pushed to be maintained on the female mold 4B of the first mold group 4 due to the difference of the diameters of different sections of the positioning column 44, so as to form the first gap G1 with the inner wall surface of the male mold 4A. In some embodiments where the diameter of the positioning column 44 is not changed, the female mold 4B is arranged at one side (below), close to the ground, of the first mold group 4, and the male mold 4A is arranged above the female mold 4B, which is not limited herein.

On the other hand, the positioning column 44 can be in surface contact with the substrate 2 through the supporting surface 441. In other words, by way of arranging the plurality of positioning holes 43 around the recess 41, a pressurizing portion (not shown in the figure) around the recess 41 is formed around the recess 41 in a manner that the positioning column 44 leans against the substrate 2 by way of surface contact to prevent the plastic from overflowing to other regions of the second surface S2 due to a too large injection pressure after the plastic enters the recess 41 through the first perforated hole 23a in the step ST3 of injecting the plastic, which is not limited herein. In other embodiments, the male mold can also be provided with the positioning hole 43, and both ends of the positioning column 44 can be provided with the latching sections 44a, which is not limited herein.

Returning to step ST3, as shown in FIG. 2B, in the embodiment, the edge contour of the first gap G1 is, for example, larger than the edge contour of the substrate 2, so that the first forming portion 31 can cover the side surface of the substrate 2, which is not limited herein. For example, in an embodiment, the edge contour of the first gap G1 can be smaller than the edge contour of the first surface S1, and in the subsequent step ST5, the second forming portion 32 covers other portions (as an outer formed on the first surface S1) of the first surface S1 through the gap of the second mold group 5 or the second perforated hole 23b.

As the previous description about the electronic device 1, in the embodiment, the substrate 2 has, for example, the body portion 2a and the wiring portion 2b. To fix the position of the wiring portion 2b during the injection of the plastic (step ST3 or step ST5), the first mold group 4 further includes a first slide block 4C. The arrangement position of the first slide block 4C corresponds to the position of the wiring portion 2b during the injection. For example, a first groove (not shown in the figure) is formed at the edge of the contact surface of the male mold 4A and the female mold 4B, and the first slide block 4C is adapted to be arranged in the first groove.

At a combining opportunity, in step ST2, for example, after the male mold 4A and the female mold 4B of the first mold group 4 are combined and the wiring portion 2b is then oppressed towards the interior of the first mold group 4 by the first slide block 4C (for example, the wall surface of the female mold 4B in FIG. 2B and FIG. 2C), so as to fix the position of the wiring portion 2b for plastic injection, which is not limited herein.

Figure 2C:
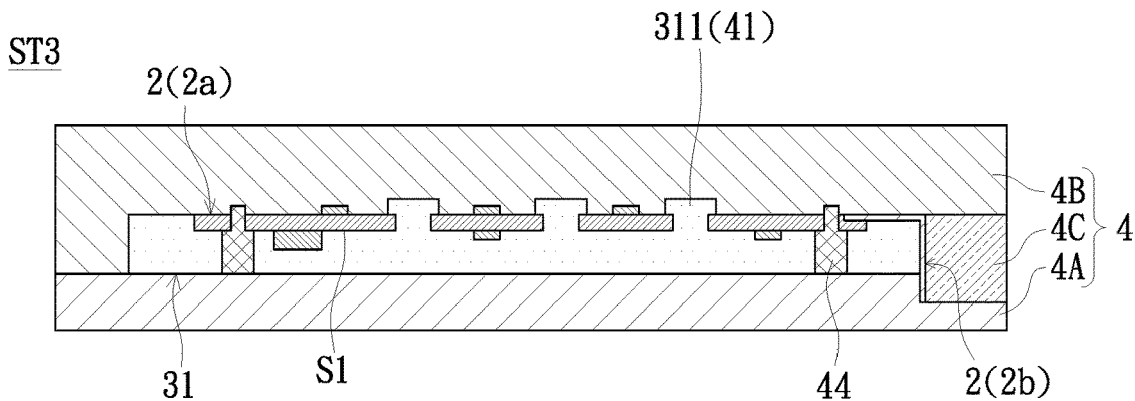

As shown in FIG. 2B and FIG. 2C, in step ST3 of injecting the plastic into the first gap G1, the plastic enters, for example, the first gap G1 from injection openings 4D formed in the male mold 4A of the first mold group 4. The quantity of the injection openings 4D is, for example, two, but is not limited. The opening positions of the injection openings 4D face, for example, the substrate 2, and are prevented from facing the first perforated hole 23a directly, which is not limited herein.

Figure 2D:
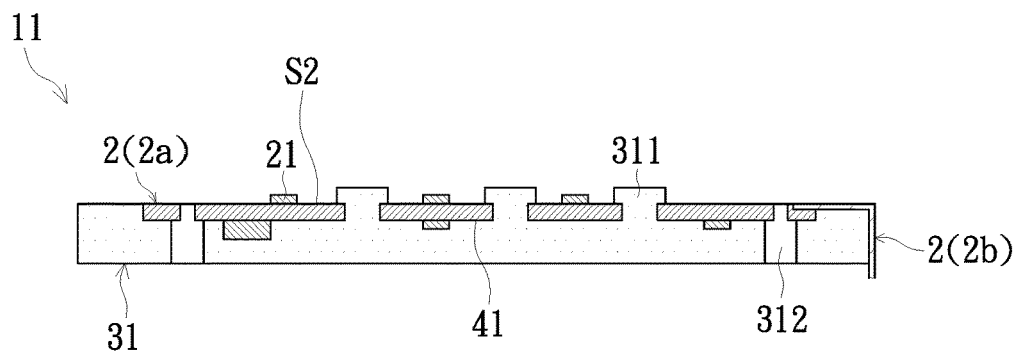
Figure 2E:
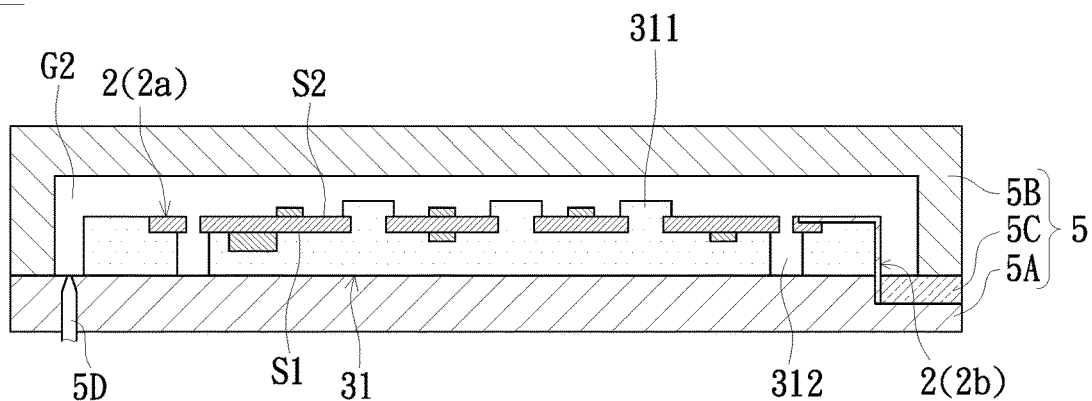
Figure 2F:
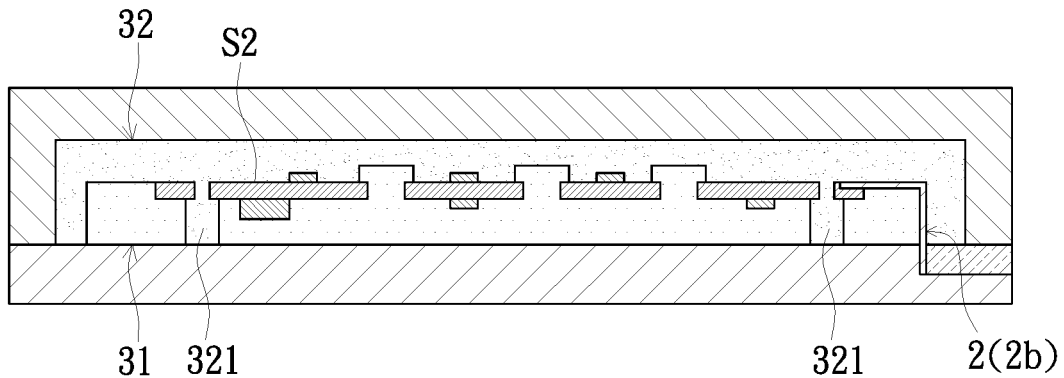
Figure 2G:
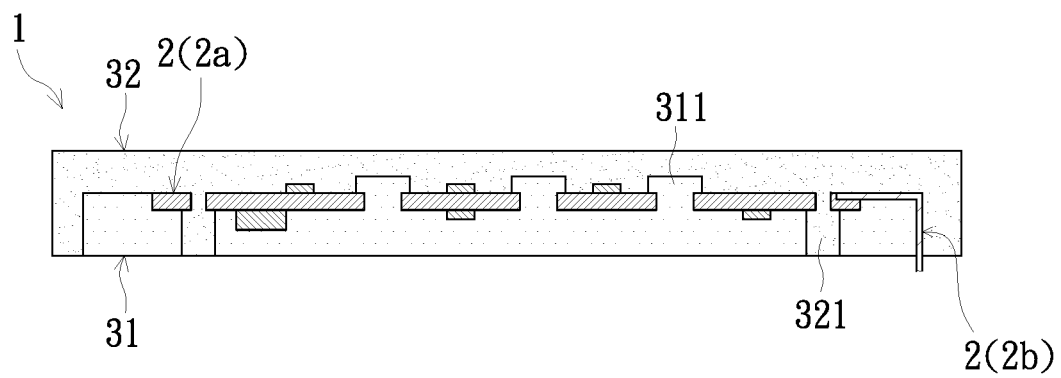

As shown in FIG. 2B to FIG. 2F, in the embodiment, before step ST5 of injecting the plastic into the second gap G2, for example, when the transition substrate 11 is formed in step ST3 and the transition substrate 11 is taken out of the first mold group 4, the first forming portion 31 is riveted to the substrate 2 through the first riveting portion 311, and the positioning column 44 is removed to form the opening in the first forming portion 31 on the transition substrate 11 and to expose the second perforated hole 23b (shown in FIG. 2B to FIG. 2D). As shown in FIG. 2B, FIG. 2E, and FIG. 2F, in step ST5 of injecting the plastic into the second gap G2, the second forming portion 32 extends to the first surface S1 from the second perforated hole 23b, and the second riveting portion 231 is formed in the opening 312. In other words, the shape of the second riveting portion 231 can correspond to the shape of the supporting section 44b of the positioning column 44. Since the second riveting portion 231 corresponds to the second perforated hole 23b, the second riveting portion corresponds to the positioning column 44 in shape as well, which is not limited herein.

As shown in the figure, the second mold group 5 used in step ST4 includes a male mold 5A and a female mold 5B. The transition substrate 11 is, for example, arranged on the male mold 5A first, so that the first forming portion 31 is in contact with the male mold 5A and positions the male mold, with the positioning way being not limited. For example, a salient point (not shown in the figure) is arranged on the first forming portion 31, or for example, a groove body (not shown in the figure) corresponding to the first forming portion 31 is arranged on the male mold 5A, so that the transition substrate 11 is embedded onto the male mold 5A, which is not limited herein. During injection, the second gap G2 is formed between the transition substrate 11 and the female mold 5B, and the plastic is injected from an injection opening 5D of the second mold group 5 towards the second gap G2 to complete the second forming portion 32.

Similarly, in the embodiment, since the substrate 2 has, for example, the body portion 2a and the wiring portion 2b, to fix the position of the wiring portion 2b during plastic injection, the second mold group 5 further includes a second slide block 5C. The arrangement position of the second slide block 5C corresponds to the position of the wiring portion 2b, and for example, a second groove (not labeled in the figure) is formed at the edge of the contact surface of the male mold 5A and the female mold 5B, and the second slide block 5C is adapted to be arranged in the groove.

At a combining opportunity, in step ST4, for example, after the male mold 5A and the female mold 5B of the second mold group 5 are combined and the wiring portion 2b is oppressed towards the interior of the second mold group 5 by the second slide block 5C (for example, the second slide block 5C is the wall surface of the male mold 5A in FIG. 2E), so as to fix the position of the bus cable 24 for plastic injection, which is not limited herein.

According to the above description, the electronic device provided by the present invention can be applied on both sides as the electronic assemblies are arranged on the two opposite surfaces, so that the cost is lowered. The electronic assemblies on the substrate are wrapped by the plastic, so that it is waterproof and dustproof. When the plastic layer is made from a transmittable material, as the electronic assembles and the plastic layer can be located on the same surface of the substrate, the electronic assemblies on the substrate can be arranged as light emitting assemblies, so that the application range of the product is enlarged. According to the method to produce the electronic device, by utilizing a mold positioning structure, the substrate can be precisely placed at a fixed position, so that it has high precision. In addition, since the substrate and the plastic layer are integrally formed without an assembling step, they are not adhered with glue additionally, so the production cost is lowered.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device, comprising:
a substrate, having a first surface and a second surface opposite to each other, wherein at least one of the first surface and the second surface is provided with at least one electronic assembly and at least one conducting wire, the at least one conducting wire is electrically connected to the at least one electronic assembly, and the substrate further has a plurality of perforated holes extending to the second surface from the first surface; and
a plastic layer, covering the first surface and the second surface and filling in the perforated holes.

2. The electronic device according to claim 1, wherein the substrate is a flexible substrate.

3. The electronic device according to claim 2, wherein the substrate has a body portion and a wiring portion adjacent to each other; the body portion has the first surface and the second surface, the wiring portion has at least one bus cable electrically connected to the at least one conducting wire, and the plastic layer further covers the wiring portion partially.

4. The electronic device according to claim 1, wherein the plastic layer comprises a first forming portion and a second forming portion, the first forming portion covers the first surface, a part of the first forming portion passes through one of the perforated holes to cover at least a part of the second surface to form a first riveting portion, and the second forming portion covers the second surface and is connected to the first riveting portion.

5. The electronic device according to claim 1, wherein the perforated holes comprise a second perforated hole, the first forming portion has an opening in the first surface to expose the second perforated hole, and the second forming portion extends to the first surface from the second perforated hole and forms a second riveting portion in the opening.

6. A method to produce an electronic device, the method comprising steps of:
providing a substrate, wherein the substrate comprises a first surface and a second surface, the first surface or/and the second surface comprises at least one electronic assembly and at least one conducting wire, the at least one conducting wire is electrically connected to the electronic assembly, and the substrate further comprises a plurality of perforated holes extending towards the second surface from the first surface;
arranging the substrate in a first mold group, wherein the second surface is in contact with an inner wall surface of the first mold group, and a first gap is formed between the first surface and the inner wall surface of the first mold group;
injecting plastic into the first gap to form a transition substrate;
mounting the transition substrate in a second mold group, wherein the first forming portion is in contact with an inner wall surface of the second mold group, and a second gap is formed between the second surface and the inner wall surface of the second mold group; and
injecting the plastic into the second gap.

7. The method to produce an electronic device according to claim 6, wherein the perforated holes comprise a first perforated hole, a recess is arranged at a position, corresponding to the first perforated hole, of the first mold group, wherein in the step of arranging the substrate in the first mold group, a third gap is formed between the second surface and the recess, and the first gap and the third gap are communicated with each other through the first perforated hole, wherein in the step of injecting the plastic into the first gap, the plastic passes through the first perforated hole to form a first riveting portion in the third gap.

8. The method to produce an electronic device according to claim 6, wherein the perforated holes comprise a second perforated hole, and the step of arranging the substrate in the first mold group further comprises arranging a positioning column in the second perforated hole to position the substrate and the first mold group.

9. The method to produce an electronic device according to claim 8, wherein the positioning column has a latching section and a supporting section, a diameter of the supporting section is greater than a diameter of the latching section, a supporting surface is formed at a connection between the supporting section and the latching section, the latching section is adapted to be inserted into the first mold group, the supporting surface is adapted to jointly clamp the substrate with the inner wall surface of the first mold group, and the supporting section is adapted to generate an interval between the substrate and the first mold group to form the first gap.

10. The method to produce an electronic device according to claim 9, wherein the perforated holes comprise a second perforated hole, the second perforated hole corresponds to a position of the positioning column, wherein before the step of injecting the plastic into the second gap, the positioning column is removed, and an opening is formed in the first forming portion and the second through hole is exposed, wherein in the step of injecting the plastic into the second gap, the second forming portion extends to the first surface from the second perforated hole and forms a second riveting portion in the opening.

11. The electronic device according to claim 6, wherein the substrate is a flexible substrate.

12. The electronic device according to claim 11, wherein the substrate has a body portion and a wiring portion, the first surface and the second surface are arranged on the body portion, the wiring portion extends from the body portion, has at least one bus cable, and is adapted to be electrically connected with the at least one conducting wire, the first mold group comprises a first slide block, and the first slide block is adapted to fix the position of the wiring portion in the step of arranging the substrate in the first mold group.

13. The electronic device according to claim 12, wherein the second mold group comprises a second slide block, and the second slide block is adapted to fix a position of the wiring portion in the step of arranging the substrate in the second mold group.

* * * * *